(12) United States Patent
Jung et al.

(10) Patent No.: US 10,879,992 B2
(45) Date of Patent: Dec. 29, 2020

(54) MIMO RECEIVER THAT SELECTS CANDIDATE VECTOR SET AND OPERATION METHOD THEREOF

(71) Applicant: SAMSUNG ELECTRONICS CO., LTD., Suwon-si (KR)

(72) Inventors: Young-seok Jung, Suwon-si (KR); In-hyoung Kim, Yongin-si (KR); Joo-yeol Yang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/454,324

(22) Filed: Jun. 27, 2019

(65) Prior Publication Data

US 2020/0145092 A1 May 7, 2020

(30) Foreign Application Priority Data

Nov. 2, 2018 (KR) .................. 10-2018-0133840

(51) Int. Cl.
| | |
|---|---|
| *H04B 7/08* | (2006.01) |
| *H04L 1/00* | (2006.01) |
| *H04B 7/0408* | (2017.01) |
| *H04L 25/06* | (2006.01) |
| *H04L 25/03* | (2006.01) |
| *H03M 13/11* | (2006.01) |
| *H04B 1/7105* | (2011.01) |

(52) U.S. Cl.
CPC ......... *H04B 7/0888* (2013.01); *H04B 7/0408* (2013.01); *H04L 1/0054* (2013.01); *H03M 13/1125* (2013.01); *H04B 1/71057* (2013.01); *H04L 25/03242* (2013.01); *H04L 25/067* (2013.01)

(58) Field of Classification Search
CPC ............ H04L 1/0054; H04L 25/03242; H04L 25/067; H04L 27/22; H04L 27/2649; H04B 1/1057; H04B 7/0888; H04B 7/0408; H03M 13/1125
See application file for complete search history.

(56) References Cited

U.S. PATENT DOCUMENTS

| | | |
|---|---|---|
| 7,945,008 B2 | 5/2011 | Milliner et al. |
| 8,000,416 B2 | 8/2011 | Teo et al. |
| 8,605,832 B1 * | 12/2013 | Eliaz ................ H04L 25/03318 375/341 |
| 8,665,977 B2 | 3/2014 | Cheng et al. |

(Continued)

*Primary Examiner* — Sophia Vlahos
(74) *Attorney, Agent, or Firm* — F. Chau & Associates, LLC

(57) ABSTRACT

A receiver for receiving a signal including a plurality of symbols through a multiple input multiple output (MIMO) channel, and an operation method of the receiver are provided. The receiver includes a demodulator configured to calculate, for each physical channel, Euclidean distances of one or more of the received symbols with respect to all candidate vectors included in an initial candidate vector set and to output information about the Euclidean distances. A vector set detector may select, based on the information, one of a plurality of candidate vector sets having different sizes, as a subsequent candidate vector set for calculating a log likelihood ratio (LLR) of other symbols of the plurality of symbols or an LLR with respect to a second signal received following the first signal.

20 Claims, 17 Drawing Sheets

(56) References Cited

U.S. PATENT DOCUMENTS

| | | | |
|---|---|---|---|
| 8,675,783 B1* | 3/2014 | Matache | H03M 13/45 |
| | | | 375/259 |
| 8,737,540 B1 | 5/2014 | Shi et al. | |
| 9,716,601 B2* | 7/2017 | Rahmati | H04L 1/0054 |
| 2006/0068709 A1* | 3/2006 | Hafeez | H04L 25/0224 |
| | | | 455/63.1 |
| 2006/0251181 A1* | 11/2006 | Shashidhar | H04L 25/03178 |
| | | | 375/262 |
| 2008/0101509 A1* | 5/2008 | Han | H04L 25/03242 |
| | | | 375/346 |
| 2009/0147890 A1* | 6/2009 | Lee | H04B 7/0851 |
| | | | 375/341 |
| 2010/0086067 A1* | 4/2010 | Oka | H04B 7/0413 |
| | | | 375/260 |
| 2011/0051861 A1* | 3/2011 | Yang | H04B 7/0854 |
| | | | 375/341 |
| 2011/0080979 A1* | 4/2011 | Duggan | H04L 1/0045 |
| | | | 375/340 |
| 2015/0030107 A1 | 1/2015 | Dhayni et al. | |
| 2015/0341143 A1 | 11/2015 | Wan et al. | |
| 2016/0164582 A1 | 6/2016 | Kankipati et al. | |
| 2017/0126360 A1 | 5/2017 | Millar et al. | |
| 2017/0142726 A1 | 5/2017 | Kim et al. | |
| 2018/0323836 A1* | 11/2018 | Arvinte | H04B 7/0417 |

* cited by examiner

MIMO RECEIVER THAT SELECTS CANDIDATE VECTOR SET AND OPERATION METHOD THEREOF

CROSS-REFERENCE TO RELATED APPLICATION

This application claims the benefit of Korean Patent Application No. 10-2018-0133840, filed on Nov. 2, 2018, in the Korean Intellectual Property Office, the disclosure of which is incorporated by reference herein in its entirety.

TECHNICAL FIELD

This disclosure relates to a multiple input multiple output (MIMO) receiver and an operation method thereof, and more particularly, to a MIMO receiver that selects a candidate vector set and an operation method thereof.

DISCUSSION OF RELATED ART

A wireless communication network may provide various types of communication content, such as audio data, video data, packet data, message data, etc. Along with the recent development of mobile services through wireless communication networks, the amount of data to be processed has been steadily rising. Thus, demand for modems supporting high-speed signal processing has also increased.

When a modem processes data at high speed, a highly complex signal processing operation may be performed, such as a broadband signal processing operation, a multiple antenna signal processing operation, etc. Accordingly, a modem performing a high speed signal processing operation has increased power consumption and heating, which may consequently introduce a risk of malfunction.

In a modulation method employing PSK (phase shift keying) or QAM (quadrature amplitude modulation), a bit stream is divided into n-bit code segments, and symbols are transmitted, where each symbol represents an n-bit code, where "n" depends on the order of modulation (e.g., n=2 for quadrature PSK, n=3 for 8 PSK). A symbol may be represented as a reference coordinate in an I-Q (In-phase-Quadrature) constellation diagram. During modulation, the phase, or amplitude and phase, of a transmitted signal during a symbol period may represent the reference coordinate in I-Q space. A received signal may be sampled every symbol period (its phase or amplitude/phase is measured) to determine the closest reference coordinate in I-Q space for the modulation system used, thereby determining which symbol was transmitted. However, due to noise, the measured I-Q coordinates corresponding to the sample may be in between two or more reference coordinates, causing uncertainty in the demodulation. For this reason, a technique for obtaining a log likelihood ratio (LLR), often called "soft information", may be used, where the LLR is a measure of uncertainty of the sample. The LLR may be provided to an error correction stage to improve the reliability of error correction. The LLR may be correlated to Euclidean distances in IQ space between the measured coordinate and the reference coordinates, and the reference coordinates may be represented by "candidate vectors". An LLR measurement technique may be particularly useful in a MIMO system, but may consume significant processing resources. Accordingly, a need exists to reduce the complexity of the processing task for the LLR measurements.

SUMMARY

Embodiments of the inventive concept provide a multiple input multiple output (MIMO) receiver and an operation method thereof, and more particularly, a MIMO receiver that selects a candidate vector set based on information derived from generating a previous log likelihood ratio (LLR), and an operation method thereof.

According to an aspect of the inventive concept, there is provided a receiver for receiving a first signal including a plurality of symbols through a multiple input multiple output (MIMO) channel, the receiver including a demodulator configured to calculate, for each physical channel, Euclidean distances of at least one or more of the received symbols with respect to all candidate vectors included in a candidate vector set and to output information about the Euclidean distances, and a vector set detector configured to select, based on the information, one of a plurality of candidate vector sets having different sizes, as a subsequent candidate vector set for calculating an LLR of other symbols of the plurality of symbols or an LLR with respect to a second signal received following the first signal.

According to another aspect of the inventive concept, there is provided an operation method, performed by a receiver, of receiving at least first and second transmit signals through a plurality of antennas, the operation method including calculating, with respect to the first transmit signal, Euclidean distances with respect to all of candidate vectors of an initial candidate vector set, selecting a first candidate vector set from among a plurality of candidate vector sets, based on information about the Euclidean distances, and generating an LLR with respect to symbols of the second transmit signal, based on the first candidate vector set.

According to another aspect of the inventive concept, there is provided a method, performed by a receiver, of detecting signals in a wireless communication system including a multiple input multiple output (MIMO) channel, the method including calculating, for each physical channel, information based on one or more of received transmit signals and predetermined candidate vectors, and generating, based on the information, a log likelihood ratio (LLR) with respect to the one or more of the received signals, selecting, based on the information, a first candidate vector set from among a plurality of candidate vector sets for generating the LLR, and generating an LLR with respect to the rest of the received transmit signals based on the first candidate vector set.

In another aspect, a receiver receives a signal modulated based on phase shift keying (PSK) or quadrature amplitude modulation (QAM) and comprising a plurality of symbols transmitted in a wireless communication system. The receiver comprises: a demodulator configured to calculate Euclidean distances of one or more of the received symbols with respect to all candidate vectors included in an initial candidate vector set and to output information about the Euclidean distances; and a vector set detector configured to select, based on the information, one of a plurality of candidate vector sets having different sizes, as a subsequent candidate vector set for calculating an LLR of other symbols of the plurality of symbols.

A non-transitory computer-readable recording medium may store instructions that, when executed by at least one processor, implements any of the above methods.

BRIEF DESCRIPTION OF THE DRAWINGS

Embodiments of the inventive concept will be more clearly understood from the following detailed description taken in conjunction with the accompanying drawings in which like reference characters may refer to like elements, features or operations, wherein.

DETAILED DESCRIPTION OF EMBODIMENTS

Hereinafter, embodiments of the inventive concept will be described in detail by referring to the accompanying drawings.

Herein, the terms "transmit" and "receive", when used as adjectives, respectively mean "transmission" and "reception".

Herein, "Euclidean distance" refers to a Euclidean distance in a constellation space such as an I-Q constellation space.

Figure 1:
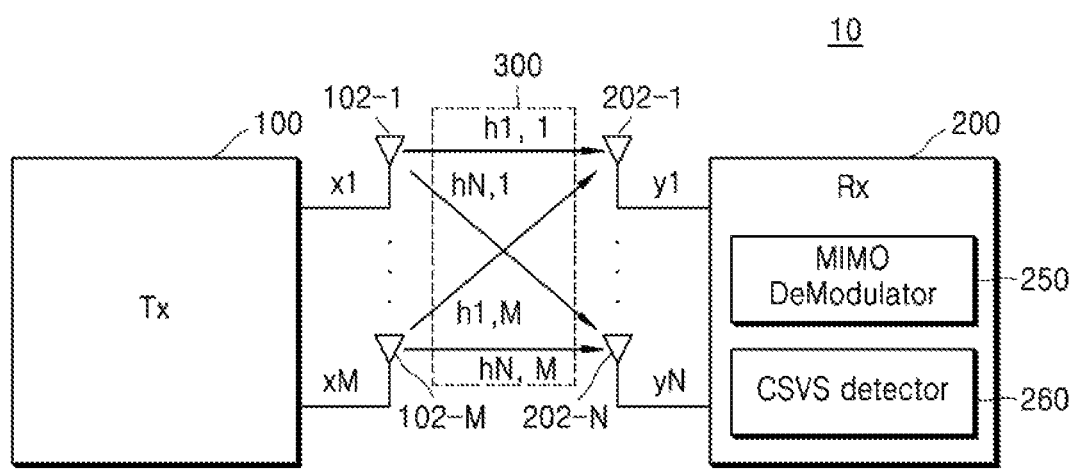
FIG. 1 is a block diagram of a communication system according to an example embodiment of the inventive concept.

FIG. 1 is a block diagram of a communication system 10 according to an example embodiment of the inventive concept. The communication system 10 may include a transmitter 100 and a receiver 200 performing wireless communication through a multiple input multiple output (MIMO) channel 300.

The communication system 10 may be any suitable type of wireless communication system including the MIMO channel 300. Some examples of the communication system 10 include a 5$^{th}$ generation wireless (5G) system, a long term evolution (LTE) system, Wifi, etc. The communication system 10 may also include wired communication system components (not shown), such as a storage system, a network system, etc. It is also noted here that some aspects of the inventive concept may be applied to non-MIMO wireless communication systems that utilize PSK or QAM modulation schemes in noisy environments (and in these cases, a SISO (single input single output) or other type of radio channel may be substituted for MIMO channel 300). Some aspects of the inventive concept may also be applied to end-to-end wired links with noisy channels.

For example, the transmitter 100 may be a base station or may be included in a base station. A base station may be a fixed station communicating with a terminal and/or another base station, and may transmit/receive data and/or control information by communicating with the terminal and/or the other base station. A base station may also be referred to as Node B, evolved-Node B (eNB), a base transceiver system (BTS), an access point (AP), etc.

For example, the receiver 200 may be a terminal or may be included in a terminal. A terminal may be any of various wireless communication devices capable of communicating with the transmitter 100 to transmit/receive data and/or control information. For example, a terminal may be referred to as user equipment (UE), a mobile station (MS), a mobile terminal (MT), a user terminal (UT), a subscriber station (SS), a wireless device, a portable device, etc.

A wireless communication network between the transmitter 100 and the receiver 200 may support communication among a plurality of users sharing available network resources. For example, information may be exchanged in the wireless communication network based on various methods, such as code division multiple access (CDMA), frequency division multiple access (FDMA), time division multiple access (TDMA), orthogonal frequency division multiple access (OFDMA), single carrier frequency division multiple access (SC-FDMA), etc.

The transmitter 100 may include a plurality of transmit antennas 102-1 through 102-M (hereinafter, M is a positive integer) and may transmit a plurality of symbols x1 through xM (which may be interchangeably referred to herein as transmit signals) through each of the plurality of transmit antennas 102-1 through 102-M, respectively, e.g., over the same frequency band. The receiver 200 may include a plurality of receive antennas 202-1 through 202-N (hereinafter, N is a positive integer) and may receive a plurality of symbols y1 through yN through each of the plurality of receive antennas 202-1 through 202-N. The signal received by each receive antenna 202-$i$ (i=any one of 1 through N) may contain signal energy from all of the transmit antennas 102-1 to 102-M. Receiver 200 may use information of channel conditions, in conjunction with a signal processing algorithm using the receive signals on all the receive antennas 202-1 to 202-N as inputs, to effectively isolate the transmit symbols x1 to xM. Thereby, individual channels within the MIMO 300 may be isolated, where each channel is associated with one of the transmit antennas 102-1 to 102-M. Hence, each individual channel may be a channel for receiving and demodulating the symbols x1 to xM transmitted by a respective one of the transmit antennas 102-1 to 102-M.

For example, when a symbol vector transmitted by the transmitter 100 is represented as x=[x1, ... xM]$^T$, a symbol vector y received by the receiver 200 may be represented by Equation 1 as follows.

$$y = Hx + n = \begin{pmatrix} h1,1 & \cdots & h1,M \\ \vdots & \ddots & \vdots \\ hN,1 & \cdots & hN,M \end{pmatrix} \begin{pmatrix} x1 \\ \vdots \\ xM \end{pmatrix} + \begin{pmatrix} n1 \\ \vdots \\ nN \end{pmatrix}$$ [Equation 1]

In Equation 1, hi,j may indicate an effective channel gain between a $j^{th}$ (j is 1 through M) transmit antenna (or "layer") and an $i^{th}$ (i=any one of 1 through N) receive antenna, and xj may indicate a transmitted symbol from the $j^{th}$ transmit antenna. The transmitted symbol xj may be measured as a phase value (as in a PSK modulation scheme) or amplitude and phase value (as in a QAM modulation scheme) representing coordinates in a signal constellation in I-Q space. Aspects regarding this will be described below.

Also, in Equation 1 above, ni may indicate additive white Gaussian noise (AWGN) from the $i^{th}$ receive antenna and ni may have a variance of $\sigma^2$ with respect to the receive antennas 202-1 to 202-N. The AWGN may include an interference signal. For example, noise of the receive antenna in the communication system 10 may be taken into account together with the effects of the interference signal. In this case, the variance of the AWGN with respect to each of the receive antennas 202-1 through 202-N may vary and be spatially correlated. Hereinafter, it will be assumed that the variance of the AWGN is the same and the AWGN is spatially uncorrelated for each receive antenna. In this case, the AWGN may be the same as noise to which a whitening filter is applied.

The receiver 200 may include a MIMO demodulator 250 and a vector set detector 260. For each channel, the MIMO demodulator 250 may calculate Euclidean distances with respect to one or more of received symbols and all candidate vectors included in a candidate vector set and may output information about the Euclidean distances. According to an example embodiment, the MIMO demodulator 250 may calculate Euclidean distances with respect to the received symbols and candidate vectors included in a candidate vector super set and may output information about the Euclidean distances. For example, the candidate vector super set may be a union of the candidate vector sets.

Also, the MIMO demodulator 250 may generate log likelihood ratios (LLIRs) based on the calculated Euclidean distances. For example, the LLRs may be a basis for soft output bit probability estimation.

The vector set detector 260 may select a candidate vector set for generating the LLRs, from among a plurality of candidate vector sets that are predetermined. According to an example embodiment, the vector set detector 260 may select one of the plurality of candidate vector sets based on the information about the Euclidean distances output from the MIMO demodulator 250.

For example, the vector set detector 260 may determine whether candidate vectors having "+1" and "−1" as bits of information included in a transmitted symbol corresponding to a receive symbol and having a least Euclidean distance are included in each of the candidate vector sets. When the candidate vectors are included in each of the candidate vector sets, the vector set detector 260 may count the number of candidate vectors included in each of the candidate vector sets. The vector set detector 260 may select the candidate vector set by comparing a counted value with a predetermined critical value.

According to an example embodiment, the vector set detector 260 may select the candidate vector set having a smallest size, from among the candidate vector sets having the counted value equal to or greater than the predetermined critical value. For example, the vector set detector 260 may compare the predetermined critical value having a certain fixed value with the counted value. As another example, the vector set detector 260 may compare the predetermined critical value having a dynamically variable value with the counted value. For example, the predetermined critical value may be dynamically variable based on a channel parameter.

According to an example embodiment, for each physical channel, the MIMO demodulator 250 may generate an LLR with respect to symbols included in received signals, based on the candidate vector set selected by the vector set detector 260. In other words, the MIMO demodulator 250 may transmit the information about the Euclidean distances derived based on the initial candidate vectors to the vector set detector 260, the vector set detector 260 may select the candidate vector set based on this information, and the MIMO demodulator 250 may generate an LLR with respect to the remaining symbols based on the selected candidate vector set.

For example, the MIMO demodulator 250 may perform an operation of generating the information about the Euclidean distances once for each physical channel and may fix the candidate vector set selected by the vector set detector 260 based on this operation, for calculating the LLR corresponding to the remaining symbols. As another example, the MIMO demodulator 250 may perform the operation of generating the information about the Euclidean distances based on a certain cycle for each physical channel, and the vector set detector 260 may select the candidate vector set based on this information generated based on the cycle. In other words, the MIMO demodulator 250 may calculate the LLR with respect to the symbols based on the candidate vector sets which are differently selected based on the certain cycle.

Accordingly, the receiver 200 according to the inventive concept may select an optimal candidate vector set based on the channel situation and may generate the LLR based on the optimal candidate vector set. Accordingly, power consumption for generating the LLR may be minimized and it may be possible to generate the LLR with less complexity in a high modulation order.

Figure 2:
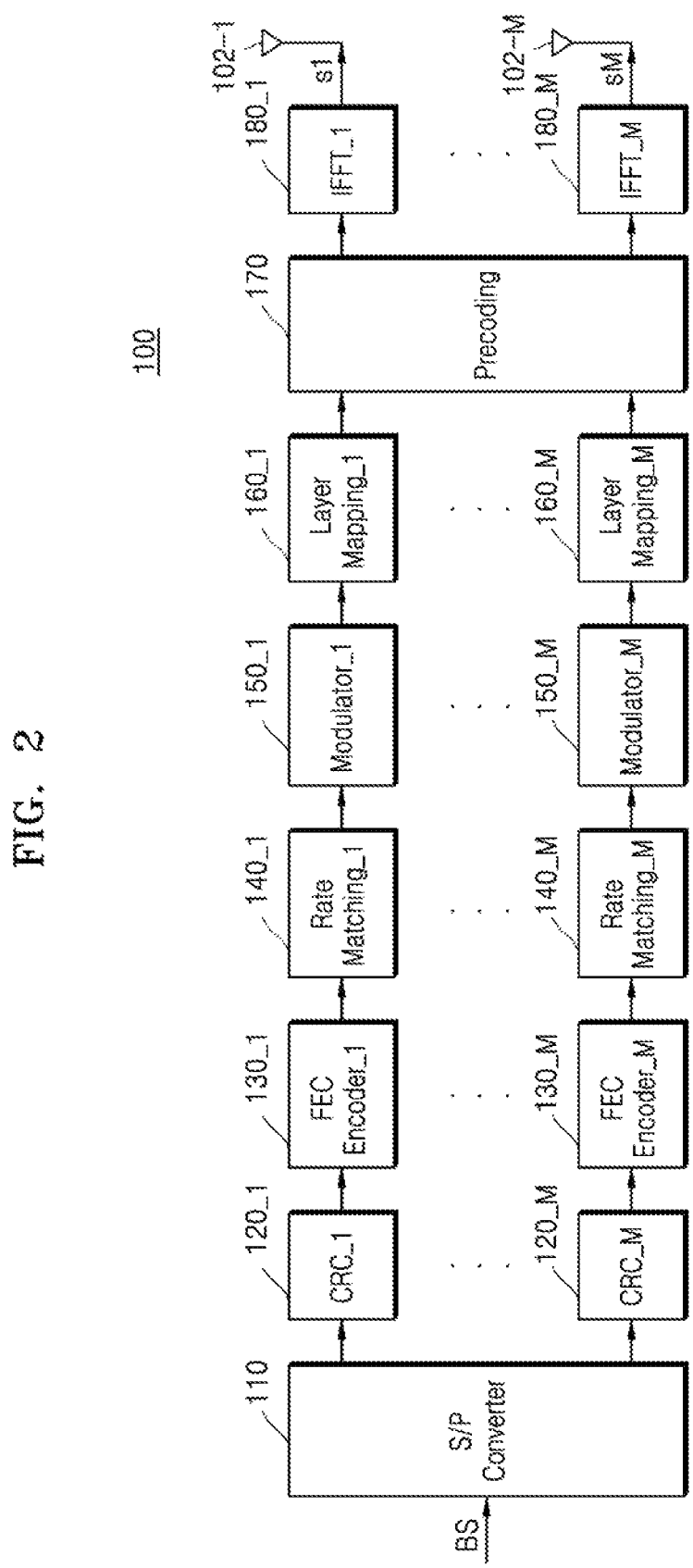
FIG. 2 is a detailed block diagram of a transmitter according to an example embodiment of the inventive concept.

FIG. 2 is a detailed block diagram of the transmitter 100 according to an example embodiment. For example, FIG. 2 may be the block diagram of components included in the transmitter 100 of FIG. 1.

Referring to FIG. 2, the transmitter 100 may include a serial to parallel (S/P) converter 110, a plurality of cyclic redundancy check (CRC) units 120_1 through 120_M, a plurality of forward error correction (FEC) encoders 130_1 through 130_M, a plurality of rate matching units 140_1 through 140_M, a plurality of modulators 150_1 through 150_M, a plurality of layer mapping units 160_1 through 160_M, a pre-coding unit 170, a plurality of inverse fast Fourier transform (IFFT) units 180_1 through 180_M, and the plurality of antennas 102-1 through 102-M.

First, an information bit stream BS, which is to be transmitted, may be input to the S/P converter 110. The S/P converter 110 may convert the information bit stream BS that is input into a parallel form to generate a plurality of information bit streams, and each of the plurality of information bit streams may be output to the CRC units 120_1 through 120_M. For example, the S/P converter 110 may convert the information bit stream BS into a codeword (or a transport block) which is an input unit of channel decoding, into a parallel form, and output the converted information bit stream BS.

The CRC units 120_1 through 120_M may perform a CRC inspection operation on the bit streams converted into the parallel form and may output signals, on which the CRC inspection operation is performed, to each of the FEC encoders 130_1 through 130_M. For example, the CRC units 120_1 through 120_M may perform the CRC inspection operation for detecting errors occurring in a transmission process.

The FEC encoders 130_1 through 130_M may apply FEC, which is an error correction sign for correcting an error occurring due to noise, to the signals received from the CRC units 120_1 through 120_M. For example, in the wireless communication system, at least one of a convolution code, a turbo code, an LDPC code, and a polar code may be used as the FEC. For example, in the case of LTE communication, the convolution code may be used for a control channel and the turbo code may be used for a traffic channel. Also, in the case of 5G communication, the polar code may be used for the control channel and the LDPC code may be used for the traffic channel.

The rate matching units 140_1 through 140_M may perform a rate matching operation on the signals output from the FEC encoders 130_1 through 130_M based on a predetermined rate matching method and may output the signals on which the rate matching operation is performed to the modulators 150_1 through 150_M. Based on the rate matching operation, the rate matching units 140_1 through 140_M may match the encoded bits with the number of modulation symbols assigned to each user.

The modulators 150_1 through 150_M may perform a modulation operation on the signals on which the rate matching operation is performed, based on a predetermined modulation method and may output the signals on which the modulation operation is performed to the layer mapping units 160_1 through 160_M. For example, the modulators 150_1 through 150_M may map the signals on which the rate matching operation is performed with signal constellations. The layer mapping units 160_1 through 160_M may distribute the modulated signals to correspond to the number of input layers of the pre-coding unit 170.

The pre-coding unit 170 may perform a pre-coding operation on the signals output from the layer mapping units 160_1 through 160_M based on a predetermined pre-coding method and may output the signals on which the pre-coding operation is performed to the IFFT units 180_1 through 180_M. For example, the pre-coding method may be determined based on feedback information received by the transmitter 100. The IFFT units 180_1 through 180_M may convert transmitted signals for each transmit antenna of a frequency domain output from the pre-coding unit 170, into a temporal domain, through the IFFT and may transmit the converted transmitted signals s1 through sM to the antennas 102_1 through 102_M.

Figure 3:
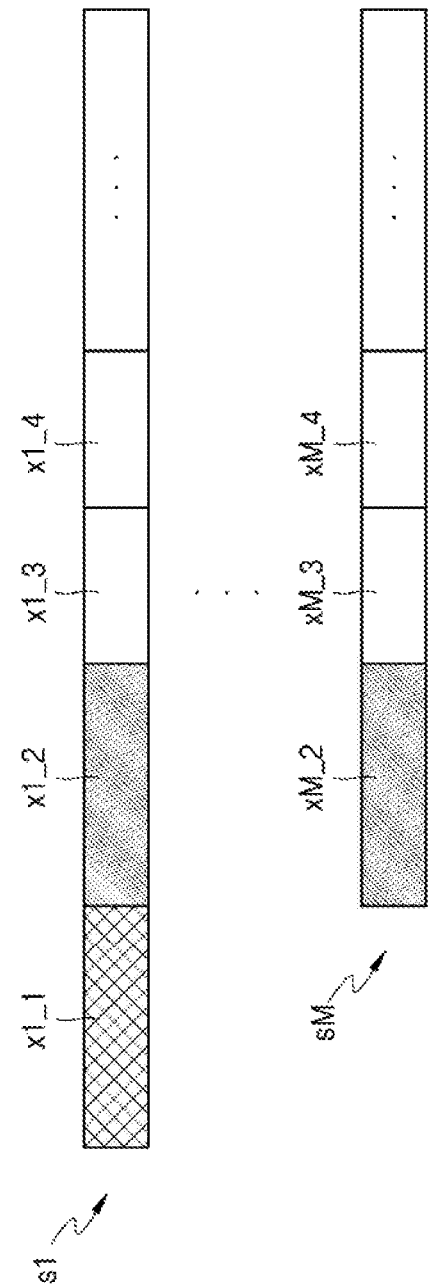
FIG. 3 shows a structure of a transmitted signal output from a transmitter, according to an example embodiment of the inventive concept.

FIG. 3 shows an example structure of a transmitted signal output from the transmitter 100 according to an example embodiment of the inventive concept. As shown in FIG. 3, a first transmitted signal s1 may include information structured in a plurality of fields x1_1 through x1_4, where each field may contain one or more symbols. Also, an $M^{th}$ transmitted signal sM may include a plurality of fields xM_2 through xM_4, each with one or more symbols. For example, the first and the $M^{th}$ transmitted signals s1 and sM may be transmitted from the antennas 102_1 and 102_*m*, respectively, using the same frequency, and may have the same timing.

As an example, the first symbol x1_1 may be a symbol for notifying the receiver 200 about a transmission method. For instance, the first symbol x1_1 may include information, such as an error correction method used to transmit data symbols, a modulation method used to transmit an encoding rate and data symbols, related to the error correction method, etc.

In an example, the second symbols x1_2 and xM_2 may be symbols for estimating channel fluctuation of the transmitted signals s1 and sM output from the transmitter 100. Also, the third symbols x1_3 and xM_3 and the fourth symbols x1_4 and xM_4 may be symbols representing data (e.g., user data, traffic).

Figure 4:
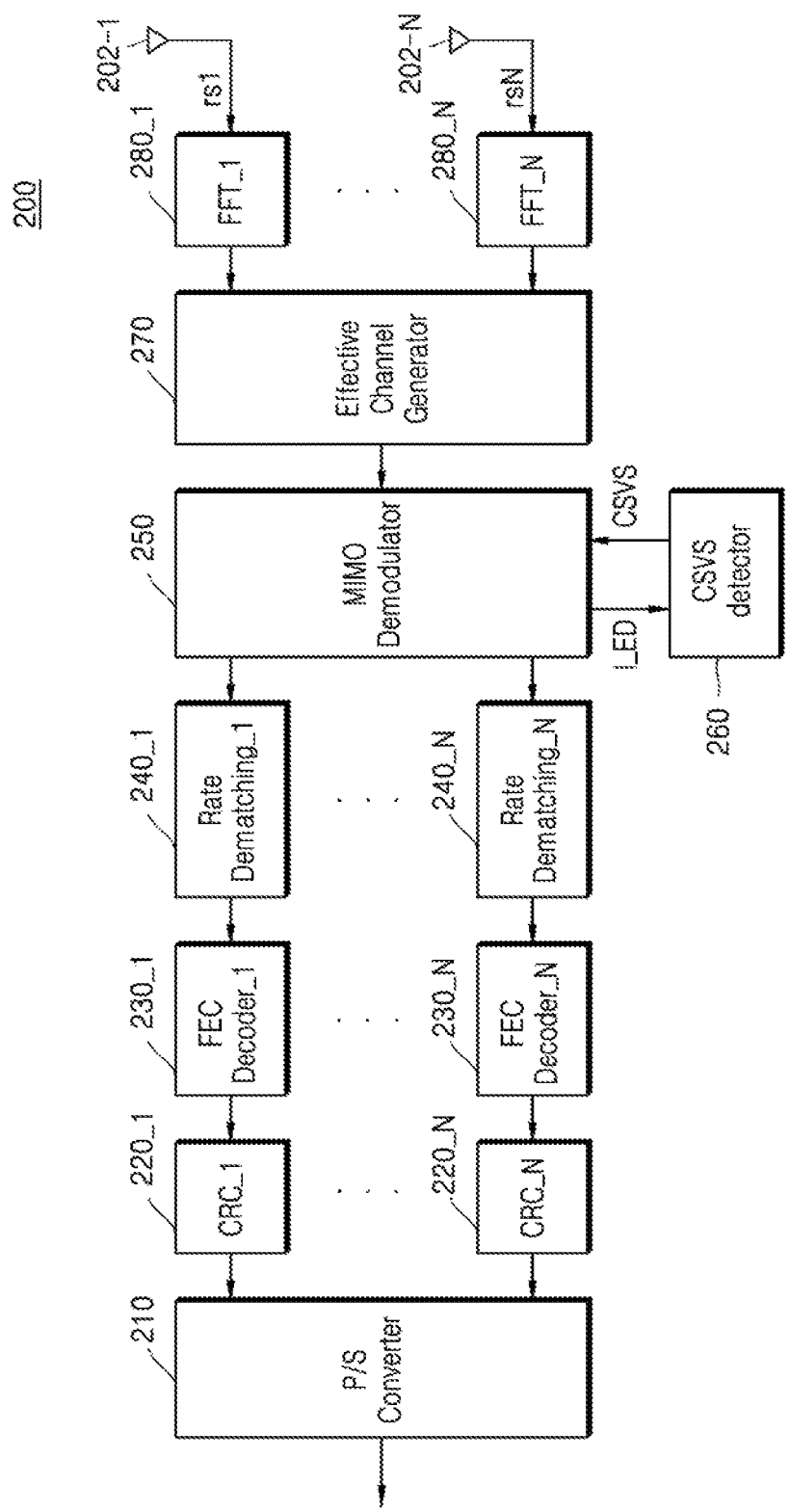
FIG. 4 is a detailed block diagram of a receiver according to an example embodiment of the inventive concept.

FIG. 4 is a detailed block diagram of the receiver 200 according to an example embodiment. For example, FIG. 4 may be a block diagram of components included in the receiver 200 of FIG. 1. As shown in FIG. 4, the receiver 200 may include a plurality of antennas 202-1 through 202-N, a plurality of FFT units 280_1 through 280_N, an effective channel generator 270, the MIMO demodulator 250, the vector set detector 260, a plurality of rate dematching units 240_1 through 240_N, a plurality of FEC decoders 230_1 through 230_N, a plurality of CRC units 220_1 through 220_N, and a parallel to serial (P/S) converter 210.

First, signals rs1 through rsN received through the antennas 202-1 through 202-N may be input to the FFT units 280_1 through 280_N and the FFT units 280_1 through 280_N may perform an FFT operation on the signals rs1 through rsN. That is, the FFT units 280_1 through 280_N may convert the received signal for each antenna of a temporal domain into a frequency domain through an FFT and may transmit the converted received signal to the effective channel generating unit 270.

The effective channel generator 270 may reflect an effect of a pre-coding method applied by the transmitter 100 on the received signals rs1 through rsN converted into the frequency domain and may output the signals rs1 through rsN on which the effect is reflected, to the MIMO demodulator 250. For example, in a communication system, two types of reference signals, namely, a cell-specific reference signal and a UE-specific reference signal, may be used to generate channels (or estimate channels). The cell-specific reference signal may be a reference signal commonly used for all UEs, while the UE-specific reference signal may be a reference signal used only for a specific UE. According to the present embodiment, in order to reflect the effect of the pre-coding applied by the transmitter 100, the effective channel generator 270 may be included in the receiver 200. In other embodiments, the channel estimation may be performed by an external device and information on the estimated channels is separately provided from the external device to the MIMO demodulator 250 (such that the effective channel generator 270 may be omitted from the receiver 200).

The MIMO demodulator 250 may perform a demodulation operation on the signals output from the effective channel generator 270, based on a demodulation method corresponding to a modulation method used by the transmitter 100. For example, the MIMO demodulator 250 may generate an LLR by using effective channels generated from the effective channel generator 270 and the received signals 202_1 through 202_N. For instance, the MIMO demodulator 250 may obtain the LLR by using a log-MAP method of Equation 2 below.

$$LLR(b_{m,k}) = \log\left(\frac{\sum_{x_{m,k} \in (C^M)^+_{m,k}} \exp\left(-\frac{\|y - Hx_{m,k}\|^2}{2\sigma^2}\right)}{\sum_{x_{m,k} \in (C^M)^-_{m,k}} \exp\left(-\frac{\|y - Hx_{m,k}\|^2}{2\sigma^2}\right)}\right)$$ [Equation 2]

In Equation 2, $b_{m,k}$ may refer to a $k^{th}$ bit (k is a positive integer) of a symbol transmitted from an $m^{th}$ transmit antenna (or an $m^{th}$ transmission "layer") (m is a positive integer in the range of 1 to M, inclusive). Also, $(C^M)^+_{m,k}$ refers to a set of transmitted signal vectors, for which $b_{m,k}$ is "+1," from among $C^M$, a set of transmitted signal vectors transmitted from the transmitter 100, and $(C^M)^-_{m,k}$ may refer to a set of transmitted signal vectors, for which $b_{m,k}$ is "−1," from among $C^M$, the set of transmitted signal vectors transmitted from the transmitter 100. For example, when $b_{m,k}$ is "+1," $b_{m,k}$ may be a bit of 0, and when $b_{m,k}$ is "−1," $b_{m,k}$ may be a bit of 1.

To calculate the LLR with less complexity than Equation 2, the approximation of Equation 3 below may be used to calculate the LLR.

$$LLR(b_{m,k}) \approx \log\left(\frac{\max_{x_{m,k} \in (C^M)^+_{m,k}} \exp\left(-\frac{\|y - Hx_{m,k}\|^2}{2\sigma^2}\right)}{\max_{x_{m,k} \in (C^M)^-_{m,k}} \exp\left(-\frac{\|y - Hx_{m,k}\|^2}{2\sigma^2}\right)}\right) =$$ [Equation 3]

$$\frac{1}{2\sigma^2}\left(\min_{x_{m,k} \in (C^M)^-_{m,k}} \|y - Hx_{m,k}\|^2 - \min_{x_{m,k} \in (C^M)^+_{m,k}} \|y - Hx_{m,k}\|^2\right)$$

However, based on Equation 3, the Euclidean distance is calculated for all transmitted signal vectors and a shortest value is calculated. Thus, the implementation complexity may increase as the number of transmit antennas or the order of modulation increases. To reduce computational complexity and the processing burden, according to an example embodiment of the inventive concept, the receiver 200 may further include the vector set detector 260 configured to search for and provide a candidate signal vector set (CSVS) for the calculation of the LLR by the MIMO demodulator 250.

First, for each effective channel, the MIMO demodulator 250 may calculate Euclidean distances with respect to one or more received symbols and all candidate vectors included in an initial candidate vector set and may output information I_ED about the calculated Euclidean distances. For example, with respect to a physical channel corresponding to the first antenna 202-1, the MIMO demodulator 250 may calculate the Euclidean distances between one or more of the symbols included in a received signal rs1 and predetermined initial candidate vectors and may output the information I_ED about the calculated Euclidean distances. The MIMO demodulator 250 may calculate the LLR with respect to the one or more symbols, based on the calculated Euclidean distances.

According to an example embodiment, the MIMO demodulator 250 may use a "candidate vector super set" as the initial candidate vector set to calculate the Euclidean distances for outputting the information I_ED. For example, the receiver 200 may include a plurality of candidate vector sets for calculating an LLR and the candidate vector super set may be formed as a union of the candidate vector sets. The candidate vector super set may include all of the candidate vectors. In other examples, a candidate vector super set omits some candidate vectors.

Next, the vector set detector 260 that received the information I_ED from the MIMO demodulator 250 may select a candidate vector set for generating the LLR from among the plurality of candidate vector sets, based on the information I_ED. That is, the vector set detector 260 may select one of the plurality of candidate vector sets based on the Euclidean distances included in the information I_ED.

According to an example embodiment, the vector set detector 260 may determine whether each candidate vector set includes candidate vectors having the shortest Euclidean distance at "+1" and "−1" with respect to each bit (e.g., $b_{m,k}$ bank with respect to all m and all k in Equation 2) of each channel (or each "layer"). Based on this determination, with respect to each of the candidate vector sets, the vector set detector 260 may count the number of candidate vectors having the shortest Euclidean distance that are included in each candidate vector set.

According to an example embodiment, the vector set detector 260 may compare the counted value with a predetermined critical value to select the candidate vector set CSVS for calculating the LLR, from among the plurality of candidate vector sets. For example, the vector set detector 260 may select the candidate vector set CSVS having the smallest size from among the candidate vector sets having the counted value equal to or greater than the predetermined critical value. The vector set detector 260 may provide the selected candidate vector set CSVS to the MIMO demodulator 250. According to an example embodiment, the vector set detector 260 may compare the counted value with the predetermined critical value having a certain fixed value. According to another example embodiment, the vector set detector 260 may compare the counted value with the predetermined critical value having a dynamically variable value. For example, the predetermined critical value may be dynamically variable based on a channel parameter.

According to an example embodiment, for each physical channel, the MIMO demodulator 250 may generate an LLR with respect to symbols included in a received signal, based on the candidate vector set selected by the vector set detector 260. In other words, for each channel, the MIMO demodulator 250 may transmit the information about the Euclidean distances derived based on one or more symbols and the initial candidate vectors to the vector set detector 260, the vector set detector 260 may select the candidate vector set CSVS based on the information, and the MIMO demodulator 250 may generate an LLR with respect to the remaining symbols based on the candidate vector set CSVS selected by the vector set detector 260.

According to an example embodiment, the MIMO demodulator 250 may perform the operation of generating the information I_ED once for each channel and may fix the candidate vector set CSVS selected by the vector set detector 260 based on the information I_ED, as the candidate vector set CSVS for calculating the LLR corresponding to the remaining symbols.

According to another example embodiment, the MIMO demodulator 250 may generate the operation of generating the information I_ED based on a certain cycle for each channel and the vector set detector 260 may select the candidate vector set CSVS based on the information I_ED generated based on the cycle. In other words, the MIMO demodulator 250 may calculate the LLR with respect to the symbols based on the candidate vector set CSVS differently selected based on the cycle.

Accordingly, the receiver 200 according to the inventive concept may select the optimal candidate vector set based on a channel situation and may generate the LLR based on the optimal candidate vector set. Thus, power consumption for generating the LLR may be minimized and the LLR may be generated with less complexity in a high order modulation.

Next, the rate dematching units 240_1 through 240_N may perform a rate dematching operation on the signal output from the MIMO demodulator 250, based on a rate dematching method corresponding to a rate matching method used by the transmitter 100. The FEC decoders 230_1 through 230_N may perform a decoding operation on the signal output from the rate dematching units 240_1 through 240_N based on an FEC decoding method corresponding to an FEC encoding method used by the transmitter 100.

The CRC units 220_1 through 220_N may perform a CRC inspection operation on the signal output from the FEC decoders 230_1 through 230_N and may output the signal on which the CRC inspection is performed to the P/S converter 210. The P/S converter 210 may convert the signal output from the CRC units 220_1 through 220_N into a serial form and may output the converted signal.

Figure 5:
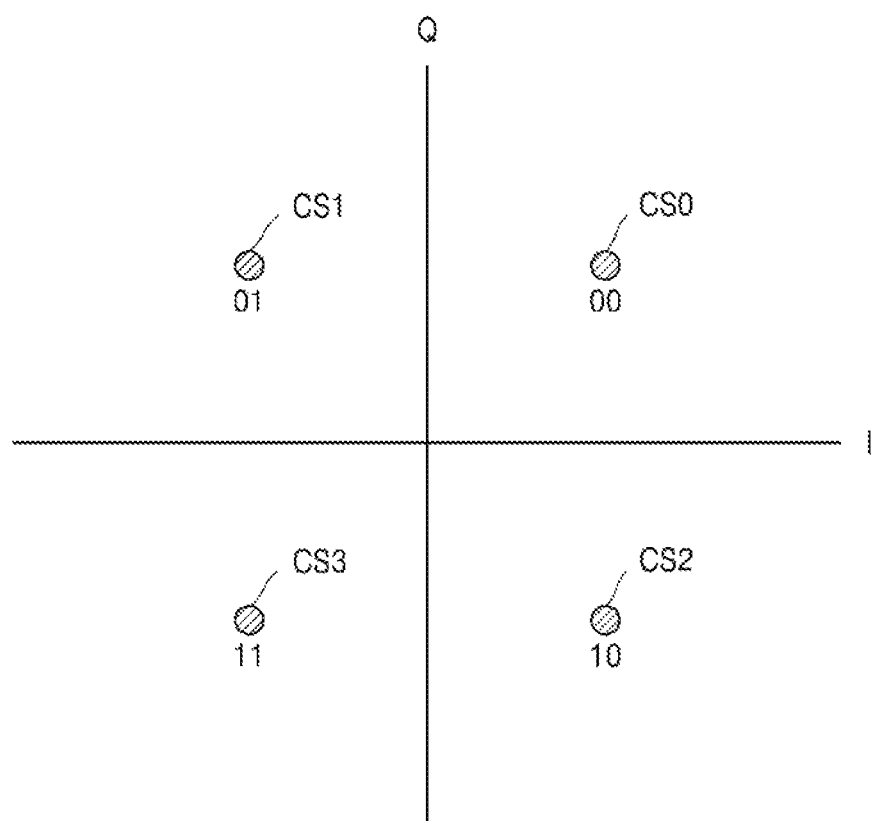
FIG. 5 is a diagram for describing a signal constellation for modulating a transmitted signal, according to an example embodiment of the inventive concept.

FIG. 5 is a diagram for describing signal constellations for modulating a transmitted signal, according to an example embodiment of the inventive concept. For example, FIG. 5 illustrates the signal constellations based on a quadrature phase shift keying (QPSK) method. Hereinafter, an example of the inventive concept will be described in detail based on the QPSK method, for convenience of explanation. However, the inventive concept may also be applied to other modulation schemes, e.g., other PSK modulation orders (nPSK, where n differs from four); and QAM modulation methods, e.g., 16QAM, 64QAM, 256QAM, and 1024QAM.

FIG. 5 illustrates a complex plane having an x axis that is a real number axis (I) and a y axis that is an imaginary number axis (Q), in which signal constellations CS0 through CS3 are indicated at each quadrant defined by the x axis and the y axis. For example, each of symbols x1 through xM transmitted by the transmitter 100 may be mapped in a modulation operation into one of the signal constellations CS0 through CS3. In the QPSK method, each of the signal constellations CS0 through CS3 may represent two bits of information. For example, the signal constellation CS0 may have information of "00," the signal constellation CS1 may have information of "01," the signal constellation CS2 may have information of "02," and the signal constellation CS3 may have information of "11."

Figure 6:
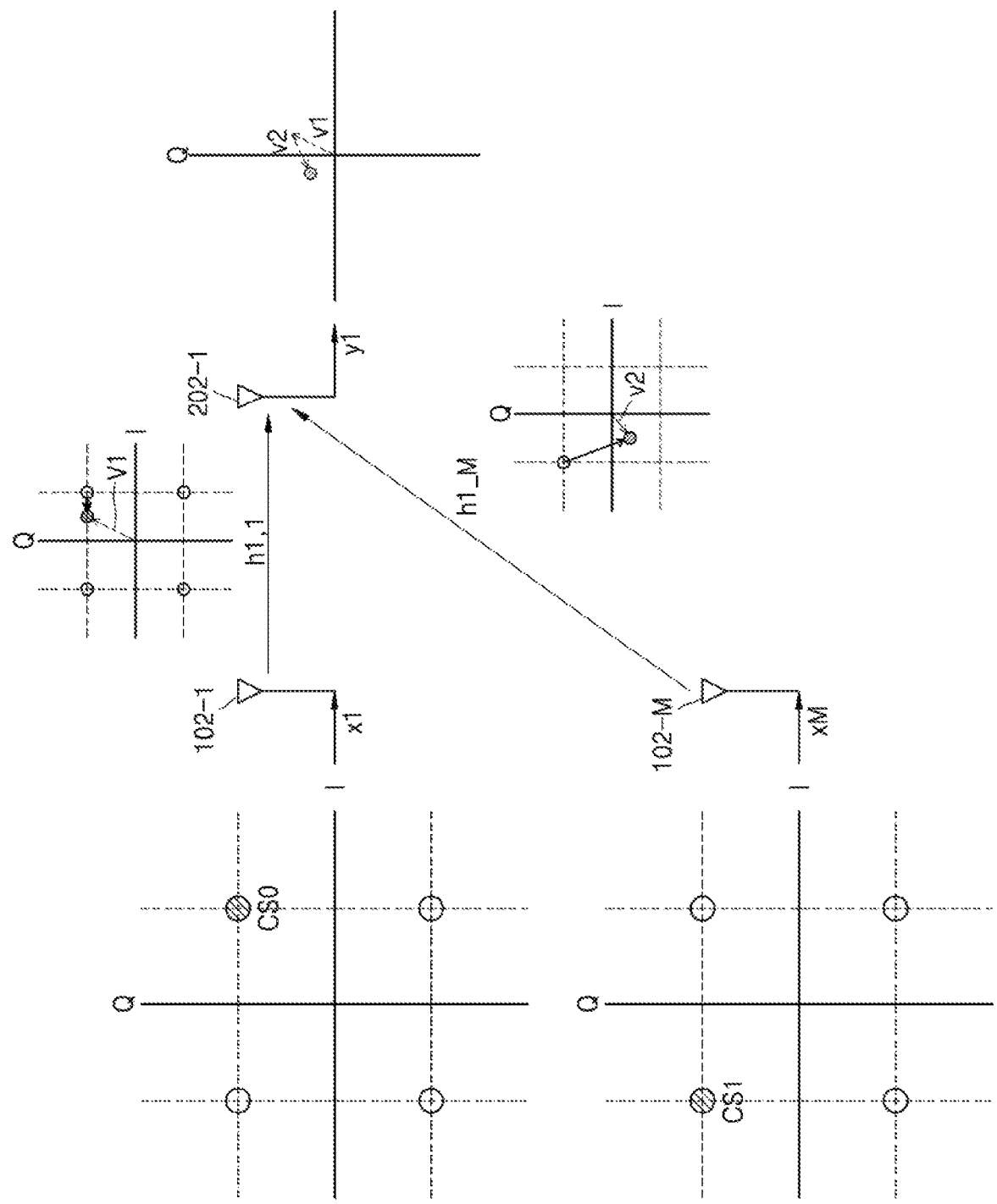
FIG. 6 is a diagram for describing transmission/reception of a modulated signal, according to an example embodiment of the inventive concept.

FIG. 6 is a diagram for describing transmission/reception of a modulated signal, according to an example embodiment. As shown in FIG. 6, the first symbol x1 transmitted through the first transmit antenna 102-1 may be mapped during modulation to the signal constellation CS0 and the $M^{th}$ symbol xM transmitted through the $M^{th}$ antenna 102_M may be mapped during modulation to the signal constellation CS1. The first symbol x1 and the $M^{th}$ symbol xM may each be received by the first receive antenna 202-1.

The first symbol x1 may be transmitted through the channel 300 formed between the two antennas 102-1 and 202-1, and thus, may be multiplied by an effective channel gain h1,1. The first symbol x1 multiplied by the effective channel gain h1,1 may be represented as a first vector v1.

The $M^{th}$ symbol xM may be transmitted through a channel formed between two antennas 102-M and 202-1, and thus, may be multiplied by an effective channel gain h1,M. The $M^{th}$ symbol xM multiplied by the effective channel gain h1,M may be represented as a second vector v2.

A symbol y1 received through the first antenna 202-1 may be represented as a vector sum of the first symbol x1 multiplied by the effective channel gain h1,1 and the $M^{th}$ symbol xM multiplied by the effective channel gain h1,M. In other words, the symbol y1 may have a vector value based on the sum of the first vector v1 and the second vector v2. MIMO demodulator 250 may utilize a signal processing signal decomposition algorithm to identify a sample (e.g., corresponding to measured amplitude/phase) of the symbol x1 taken during a symbol period, and a sample of the signal xM taken during the symbol period, using all of the signal energy received by both of the receive antennas. The symbols x1 and xM may be referred to as a symbol of an individual "channel", e.g., a first channel and an $M^{th}$ channel, respectively. Each of these channels may also be referred to herein interchangeably as a "physical channel".

For example, the receiver 200 may receive the symbol for each channel as described above, and to demodulate the symbol, candidate vectors on the complex plane may be used. When the QPSK method is used and there are two transmit antennas, a symbol separately based on one of four signal constellations may be transmitted from each transmit antenna. Accordingly, in this case, 16 (i.e., 4×4) candidate vectors may be provided.

Figure 7A:
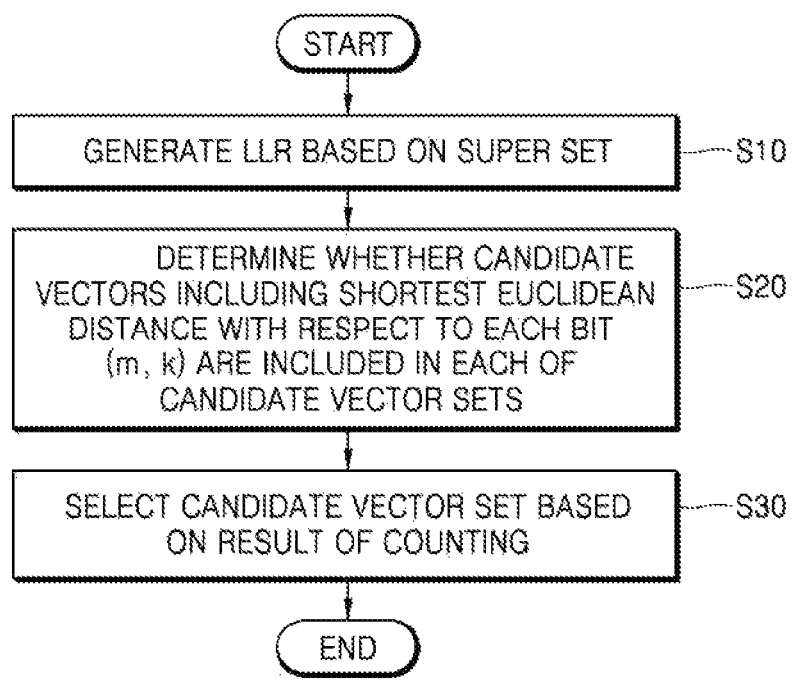
FIG. 7A is a flowchart of an operation of a receiver, according to an example embodiment of the inventive concept.
Figure 7B:
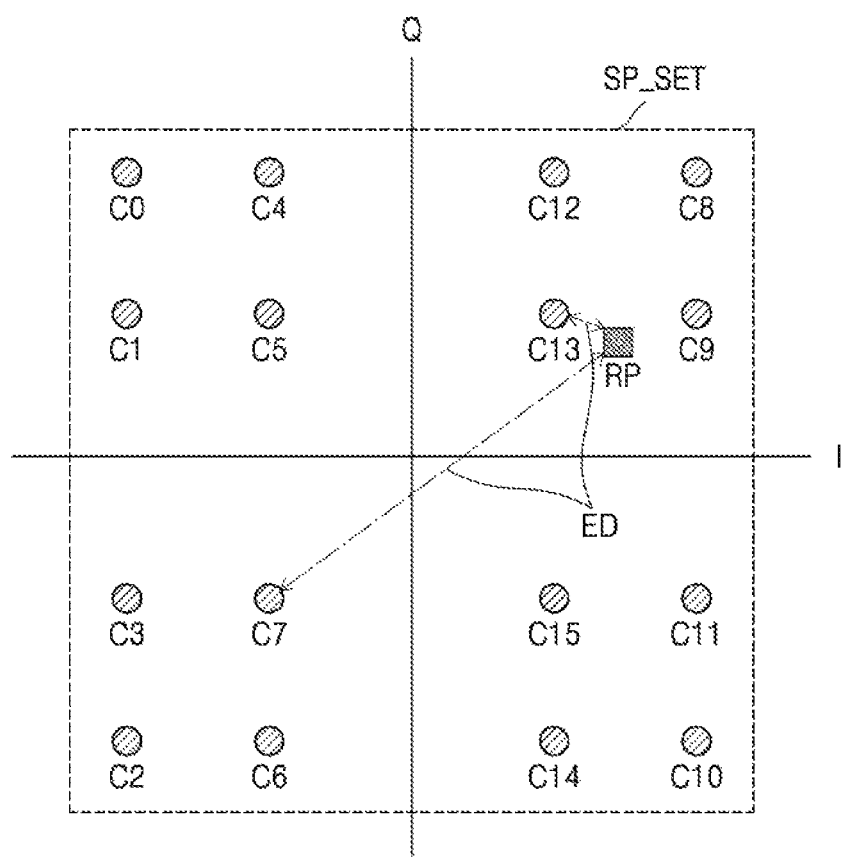
FIG. 7B is a view of a complex plane indicating candidate vectors.

FIG. 7A is a flowchart of an operation of the receiver 200, according to an example embodiment of the inventive concept, and FIG. 7B illustrates a complex plane in which candidate vectors are indicated. Hereinafter, FIGS. 7A and 7B will be described with reference to FIG. 4.

Referring to FIG. 7A, the receiver 200 may generate the LLR based on one or more symbols and the candidate vector super set, for each channel, in operation S10. For example, for each channel, the MIMO demodulator 250 may derive the Euclidean distances between the received symbols and the candidate vectors and generate the LLR based on the Euclidean distances.

Referring to FIG. 7B, a plurality of candidate vectors C0 through C15 may be indicated on the complex plane. For example, the MIMO demodulator 250 may estimate an effective channel gain for each channel and may provide the plurality of candidate vectors derived for each channel based on the estimated effective channel gain. In other words, a location of each of the candidate vectors C0 through C15 on the complex plane may be different for each channel and may be determined based on the estimated effective channel gain.

For example, a symbol received through one channel may be represented as a point RP on the complex plane and the MIMO demodulator 250 may derive the Euclidean distance ED between the point RP and each of the candidate vectors C0 through C15. The MIMO demodulator 250 may output the LLR based on the derived Euclidean distances ED and may output the information I_ED about the Euclidean distances ED to the vector set detector 260.

According to an example embodiment, a candidate vector super set SP_SET may be a set having a maximum size from among the plurality of candidate vector sets provided for calculating the LLR. The candidate vector super set SP_SET may be formed as a union of the plurality of candidate vector sets provided for calculating the LLR. For example, the candidate vector super set SP_SET may be a set including all of the candidate vectors C0 through C15. As noted above, some candidate vectors may be omitted in other embodiments.

Next, the receiver 200 may count whether candidate vectors having a shortest Euclidean distance with respect to each bit of each channel are included in each of the candidate vector sets, in operation S20. For example, the vector set detector 260 may determine, based on the received information I_ED, whether the candidate vectors having the shortest Euclidean distance at "+1" and "−1" with respect to each bit of each channel are included in each candidate vector set. Operation S20 may be represented by Equation 4 below.

$$f_c(l) = \sum_{s=0}^{S-1}\sum_{m=0}^{M-1}\sum_{k=0}^{K-1}\sum_{j\in(+1,-1)} Ind \quad \text{[Equation 4]}$$
$$\left(\left(\operatorname*{argmin}_{x_{s,m,k}\in \rho_{l,U}((C^M)^j_{s,m,k})} \|y_s - H_s x_{s,m,k}\|^2 \right)\in \right.$$
$$\left. \left(\rho_l(C^M)^j_{s,m,k}\right)\right)$$

In Equation 4, K may be the number of bits used in signal constellations. Also, when the state is true, a Ind (state) function may be 1, and when the state is false, the Ind (state) function may be 0. Also, argmin denotes that a minimum value is to be derived.

Next, the receiver 200 may select the candidate vector set CSVS for calculating the LLR based on a result of the counting operation, in operation S30. According to an example embodiment, the vector set detector 260 may compare the counted value generated in operation S20 with a predetermined critical value to select the candidate vector set CSVS for calculating the LLR from among the plurality of candidate vector sets. For example, the vector set detector 260 may select a candidate vector set having a smallest size from among candidate vector sets having corresponding counted values≥the predetermined critical value, as the candidate vector set CSVS for calculating the LLR. The rule for selecting the candidate vector set according to the example above may be represented by Equation 5 below.

$$l = \operatorname*{argmin}_{\{l:\, f_c(l)\geq \delta\times S\times M\times K\times 2\}} \sum_{s=0}^{S-1}\sum_{m=0}^{M-1}\sum_{k=0}^{K-1}\sum_{j\in(+1,-1)} |\rho_l((C^M)^j_{s,m,k})| \quad \text{[Equation 5]}$$

In Equation 5, $\rho_l((C^M)_{s,m,k}^j)$ may denote the number of elements included in the set $\rho_l((C^M)_{s,m,k}^j)$. Also, δ may be the critical value to be compared with the counted value.

Figure 8A:
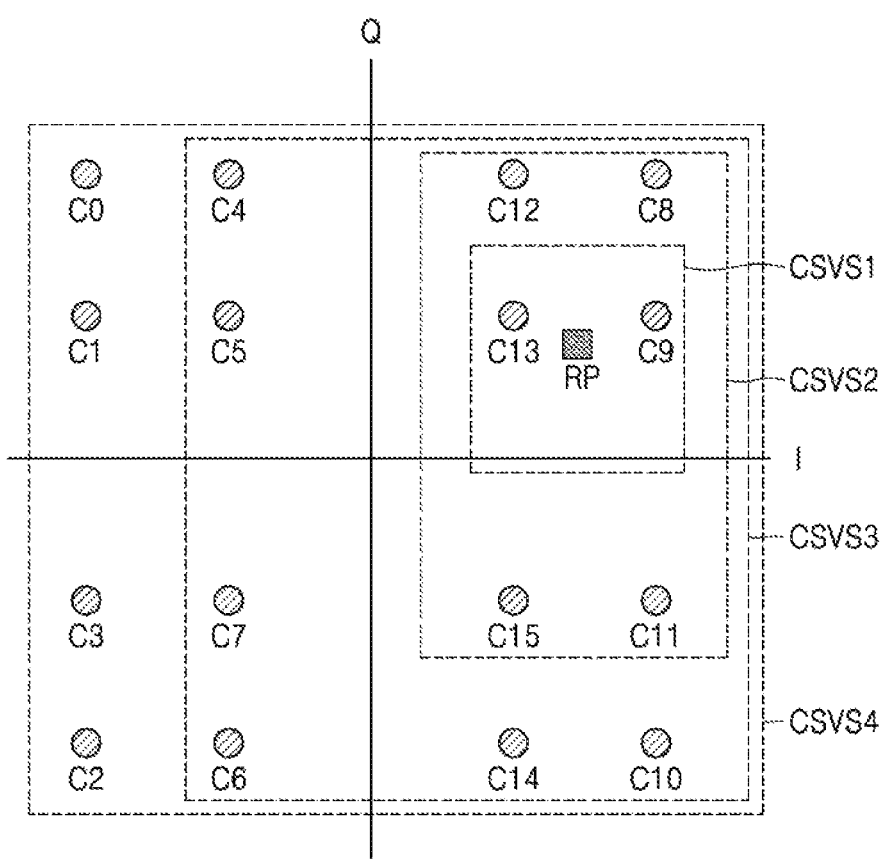
FIGS. 8A and 8B illustrate respective examples of candidate vector sets, according to example embodiments of the inventive concept.
Figure 8B:
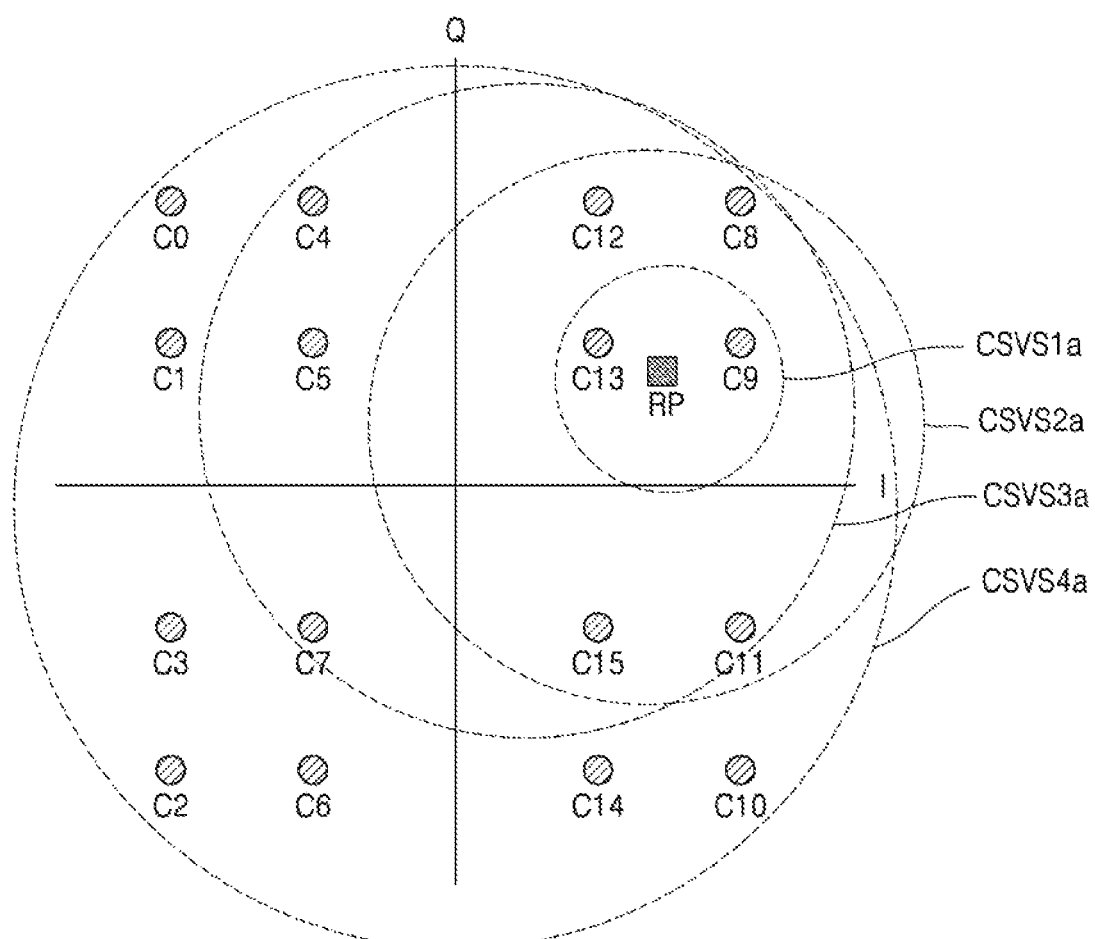

FIGS. 8A and 8B illustrate examples of candidate vector sets according to example embodiments of the inventive concept.

Referring to FIG. 8A, a plurality of candidate vector sets CSVS1 through CSVS4 may be indicated on a complex plane on which the plurality of candidate vectors C0 through C15 are indicated. For example, the plurality of candidate vector sets CSVS1 through CSVS4 may be conceptually indicated on the complex plane as a square shape. In other embodiments, different shapes may be designated. Referring to FIG. 8B, candidate vector sets CSVS1a through CSVS4a may be conceptually indicated as a circular shape.

For example, the first candidate vector set CSVS1 may include two candidate vectors C9 and C13 and the second candidate vector set CSVS2 may include six candidate vectors C8, C9, C11, C12, C13, and C15. Also, the third candidate vector set CSVS3 may include twelve candidate vectors C4 through C15 and the fourth candidate vector set CSVS4 may include sixteen candidate vectors C0 through C15. According to the present example embodiment, the fourth candidate vector set CSVS4 may be the candidate vector super set.

As a size of the candidate vector set increases, the accuracy of deriving the LLR may increase, but the number of calculations and power consumption may increase for the increased size of the candidate vector set. Alternatively, as a size of the candidate vector set decreases, the number of calculations and power consumption for deriving the LLR may decrease, but the accuracy of deriving the LLR may decrease. The receiver 200 according to the inventive concept may select an optimal candidate vector set based on a channel state, and thus, a target accuracy of deriving the LLR may be satisfied while the power consumption may be decreased.

Figure 9A:
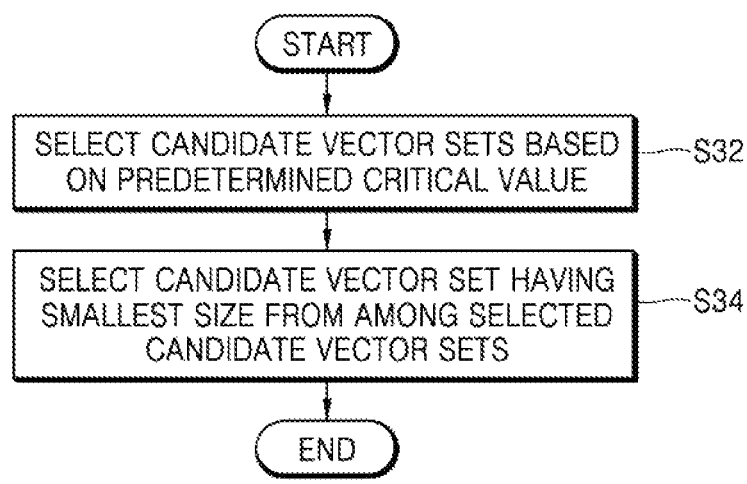
FIGS. 9A and 9B are views for describing an operation of selecting a candidate vector set, according to an example embodiment of the inventive concept.
Figure 9B:
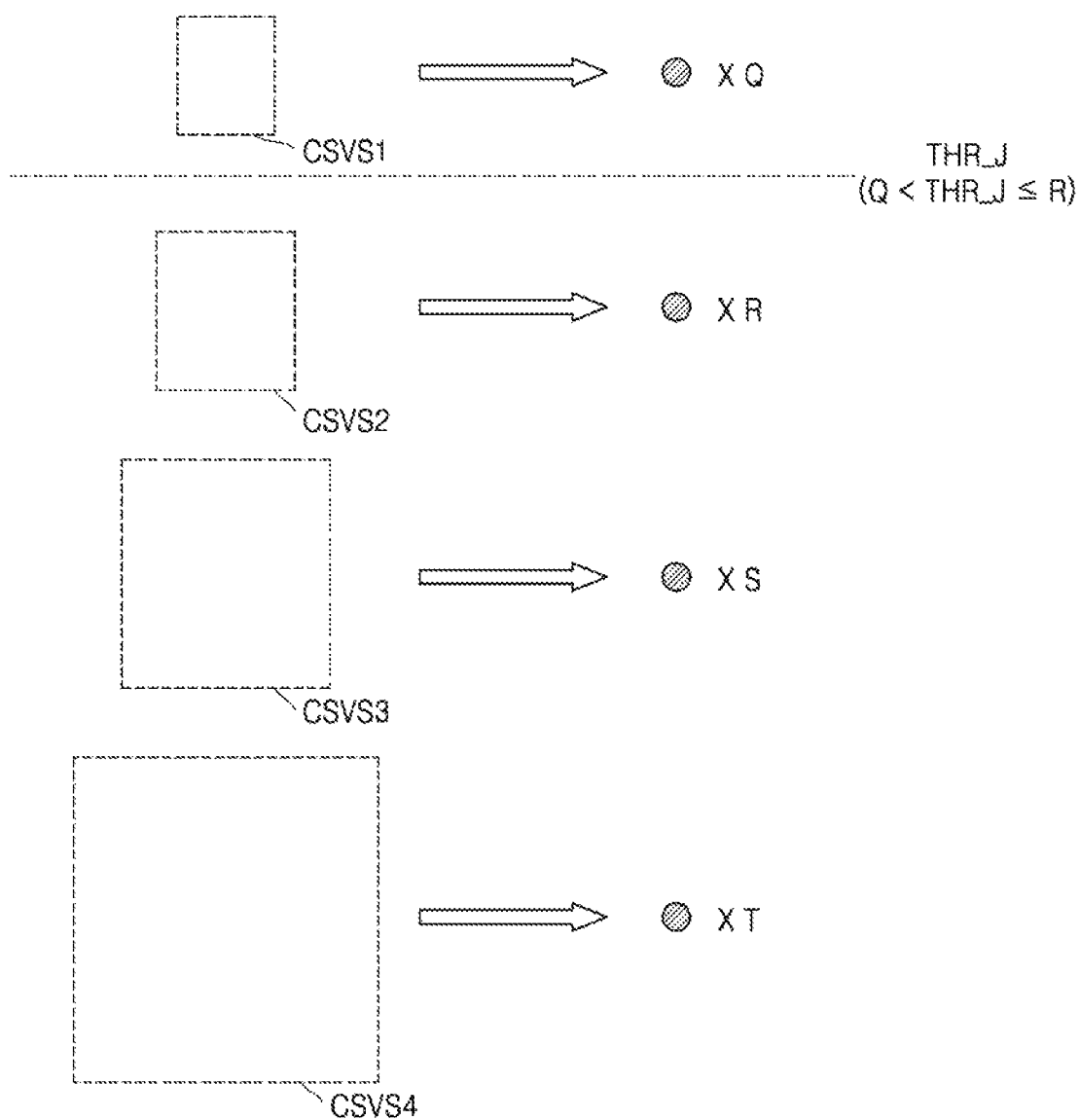

FIGS. 9A and 9B are views for describing an operation of selecting a candidate vector set according to an example embodiment. In detail, FIG. 9A is a flowchart of an example of operation S30 of FIG. 7A and FIG. 9B is a conceptual view indicating the operation of selecting the candidate vector set based on a critical value. Hereinafter, FIGS. 9A and 9B will be described by referring to FIG. 4.

Referring to FIG. 9A, the receiver 200 may select one or more candidate vector sets from among the plurality of candidate vector sets, based on a counted value and a predetermined critical value, in operation S32. FIG. 9B illustrates the number of candidate vectors having a shortest Euclidean distance with respect to each bit of each channel that are included in each of the candidate vector sets CSVS1 through CSVS4. For example, the number of candidate vectors having the shortest Euclidean distance with respect to each bit of each channel that are included in the first candidate vector set CSVS1 may be Q, the number of candidate vectors having the shortest Euclidean distance with respect to each bit of each channel that are included in the second candidate vector set CSVS2 may be R, the number of candidate vectors having the shortest Euclidean distance with respect to each bit of each channel that are included in the third candidate vector set CSVS3 may be S. and the number of candidate vectors having the shortest Euclidean distance with respect to each bit of each channel that are included in the fourth candidate vector set CSVS4 may be T (all of Q, R, S, and T are positive integers (Q<R<S<T)).

For example, when a critical value THR_J is predetermined as a value greater than Q and equal to or less than R, the first candidate vector set CSVS1 having the counted value less than the critical value THR_J may be excluded from the selection. In other words, in operation S32, the second through fourth candidate vector sets CSVS2 through CSVS4 may be selected based on the critical value THR_J. According to an example embodiment, the critical value THR_J may be a fixed value or may be dynamically changeable based on a channel parameter, etc.

Next, the receiver 200 may select the candidate vector set having the smallest size from among the selected candidate vector sets as the candidate vector set CSVS for calculating the LLR, in operation S34. Thus, from among the second through fourth candidate vector sets CSVS2 through CSVS4 selected in operation S32, the second candidate vector set CSVS2 having the smallest size may be selected as the candidate vector set for calculating the LLR and provided to the MIMO demodulator 250.

Figure 10:
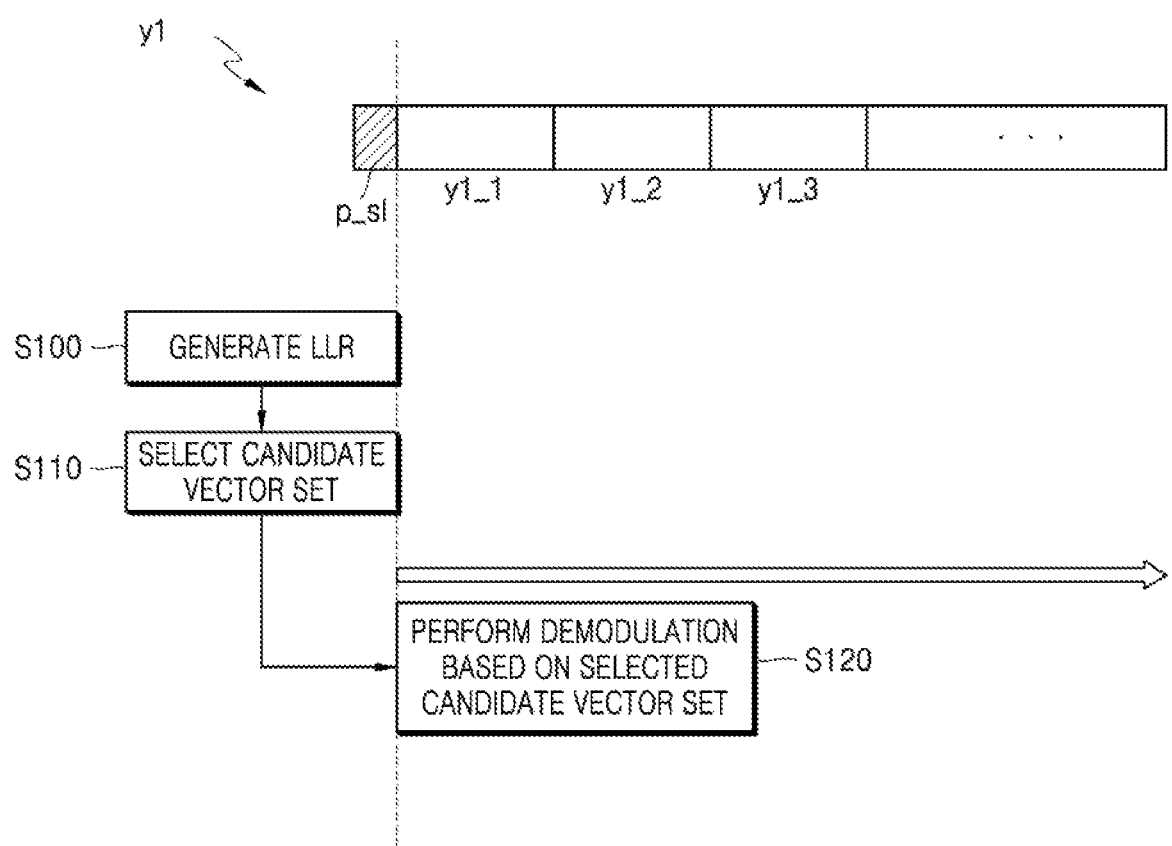
FIG. 10 is a diagram for describing an operation of a receiver, according to an example embodiment of the inventive concept.

FIG. 10 is a diagram for describing an operation of the receiver 200, according to an example embodiment. Hereinafter, FIG. 10 will be described with reference to FIG. 4.

Referring to FIG. 10, the signal y1 received through the first antenna 202-1 may be structured in a plurality of fields y1_1 through y1_3, each containing one or symbols. According to an example embodiment, the MIMO demodulator 250 may output the information I_ED about the Euclidean distances to the vector set detector 260 based on a portion p_s1 of the first field y1_1 (where the portion is at least one symbol) and the vector set detector 260 may select the candidate vector set CSVS based on the information I_ED.

In detail, the MIMO demodulator 250 may derive the Euclidean distances between the portion p_s1 of the first field y1_1 and the candidate vectors and may generate the LLR based on the Euclidean distances, in operation S100. According to an example embodiment, the MIMO demodulator 250 may generate the LLR based on the derived Euclidean distances between the portion p_s1 of the first field y1_1 and the candidate vectors included in the candidate vector super set. The MIMO demodulator 250 may transmit the information I_ED about the derived Euclidean distances to the vector set detector 260.

Next, the vector set detector 260 may select the candidate vector set CSVS based on the information I_ED in operation S110. Thus, the optimal candidate vector set for calculating an LLR of the remaining symbols may be selected, based on only the portion p_s1 of the first field y1_1.

Next, the MIMO demodulator 250 may perform demodulation on the rest of the first field y1_1 and other fields y1_2 and y1_3, based on the selected candidate vector set CSVS, in operation S120. According to an example embodiment, the MIMO demodulator 250 may fix the candidate vector set selected in operation S110 and may perform sequential demodulations based on the fixed candidate vector set.

Figure 11:
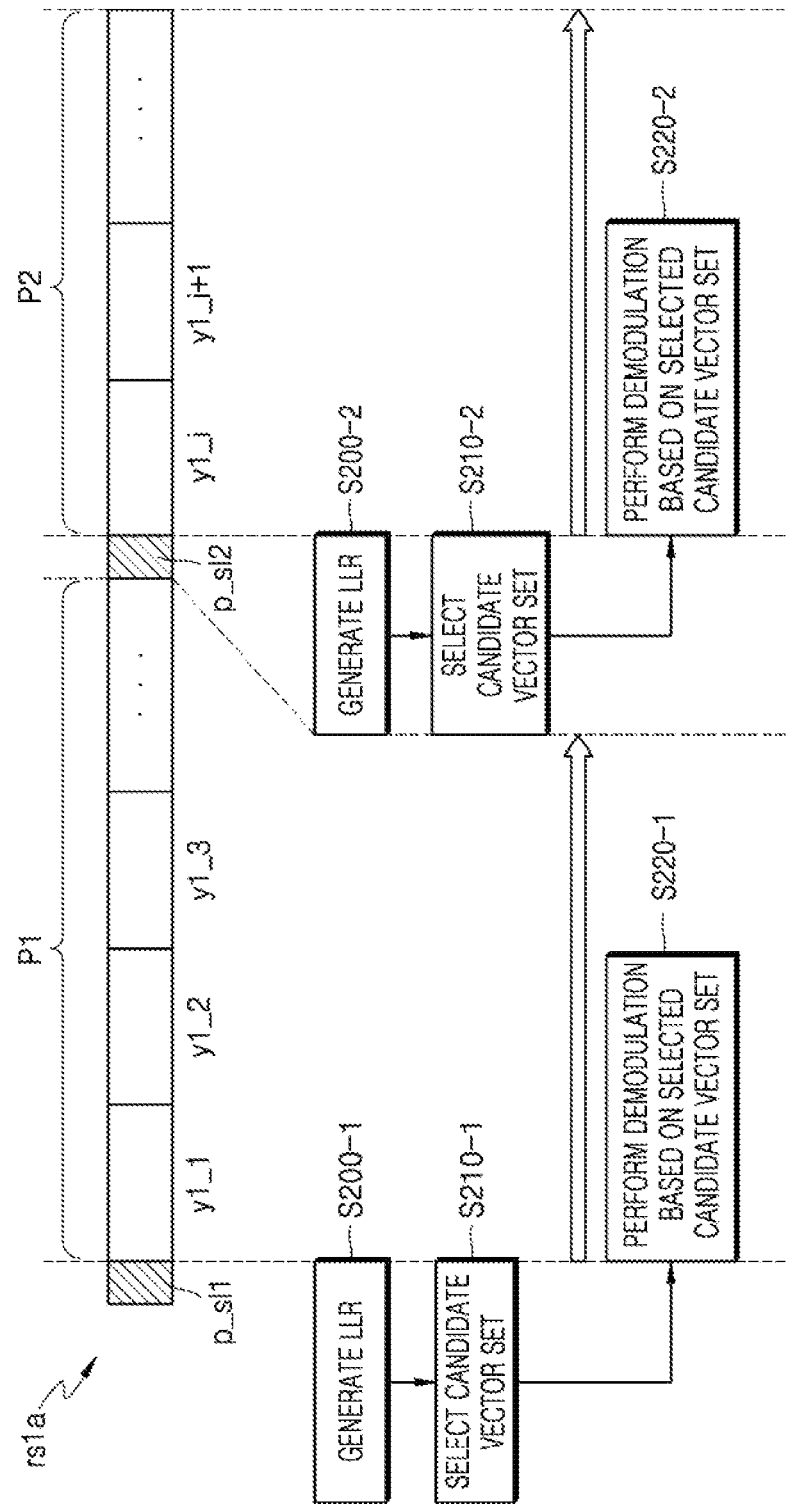
FIG. 11 is a diagram for describing an operation of a receiver, according to another example embodiment of the inventive concept.

FIG. 11 is a diagram for describing an operation of the receiver, according to another example embodiment. Hereinafter, FIG. 11 will be described with reference to FIG. 4.

Referring to FIG. 11, a signal rs1$a$ received through the first antenna 202-1 may include a plurality of fields y1_1 through y1_3, . . . , y1_$i$, y1_$i$+1, each containing one or more symbols. According to an example embodiment, the MIMO demodulator 250 may derive the Euclidean distances between a portion p_s11 of the first field y1_1 and the candidate vectors and may generate the LLR based on the derived Euclidean distances, in operation S200-1. The vector set detector 260 may select the candidate vector set CSVS based on the information I_ED derived in operation S200-1, in operation S210-1.

According to an example embodiment, the MIMO demodulator 250 may perform demodulation based on the candidate vector set CSVS selected in operation S210-1, during a certain cycle, in operation S220-1. For example, a first cycle p1 may be predetermined, and the MIMO demodulator 250 may perform, during the first cycle p1, the demodulation based on the candidate vector set CSVS selected based on the portion p_s11 of the first field y1_1.

After the first cycle p1 has ended, the MIMO demodulator 250 may derive the Euclidean distances between a portion p_s12 of the $i^{th}$ field y1_1 and the candidate vectors and generate the LLR based on the derived Euclidean distances in operation S200-2. The vector set detector 260 may select the candidate vector set CSVS based on the information I_ED derived in operation S200-2, in operation S210-2.

According to an example embodiment, the MIMO demodulator 250 may perform, during a certain cycle, demodulation based on the candidate vector set CSVS selected in operation S210-2, in operation S220-2. For example, a second cycle p2 may be predetermined and the MIMO demodulator 250 may perform, during the second cycle p2, demodulation based on the candidate vector set CSVS selected based on the portion p_s12 of the $i^{th}$ field y1_$i$. (Note—a portion of the signal rs1$a$ may be referred to herein as a "first signal" received during the first cycle p1 and another portion of the signal rs1$a$ may be referred to herein as a "second signal" received during the second cycle p2.)

Figure 12:
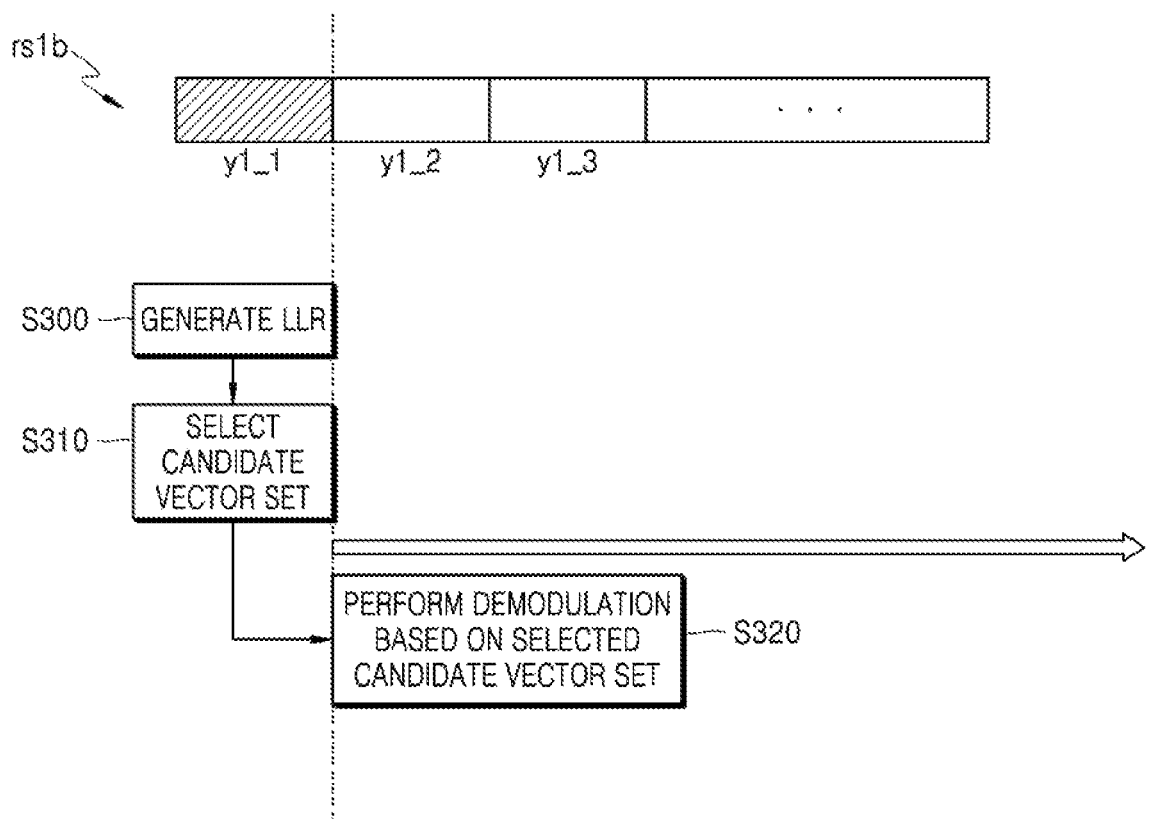
FIG. 12 is a diagram for describing an operation of a receiver, according to another example embodiment of the inventive concept.

FIG. 12 is a diagram for describing an operation of the receiver, according to another example embodiment. Aspects of FIG. 12 that are the same as those of FIG. 10 will not be described.

Referring to FIG. 12, the MIMO demodulator 250 may derive the Euclidean distances between the entirety of the first field y1_1 and the candidate vectors and generate the LLR based on the derived Euclidean distances, in operation S300. According to an example embodiment, the MIMO demodulator 250 may generate the LLR based on the Euclidean distances between the entirety of the first field y1_1 and the candidate vectors included in the candidate vector super set. The MIMO demodulator 250 may transmit the information I_ED about the derived Euclidean distances to the vector set detector 260.

Next, the vector set detector 260 may select the candidate vector set CSVS based on the information I_ED in operation S310. Thus, the optimal candidate vector set for calculating the LLR of remaining symbols may be selected, based on the first field y1_1. Next, the MIMO demodulator 250 may perform demodulation on the other fields y1_2 and y1_3 based on the selected candidate vector set CSVS in operation S320.

Referring again to FIG. 3, the methods of FIGS. 10, 11 and 12 may be applied in a similar manner to calculate the LLR of the symbols in the signals s1 and sM of FIG. 3. For instance, in any of FIG. 10, 11 or 12, the field y1_1 may be the field x1_1 of FIG. 3, and the candidate vector super set may be utilized to compute the LLR of the symbol(s) in field x1_1. Subsequently, a candidate vector set may be selected based on the information I_ED for not only the symbols in fields x1_2, x1_3 and x1_4 . . . of the signal s1, but also for all the symbols of signal sM. In other words, the symbols in the fields xM_2, xM_3 . . . may not use the super CSVS but may instead just use a selected CSVS which may be a CSVS smaller than the super CSVS, and the selection is based on the Euclidean distances measured with respect to the symbols of field x1_1.

Figure 13:
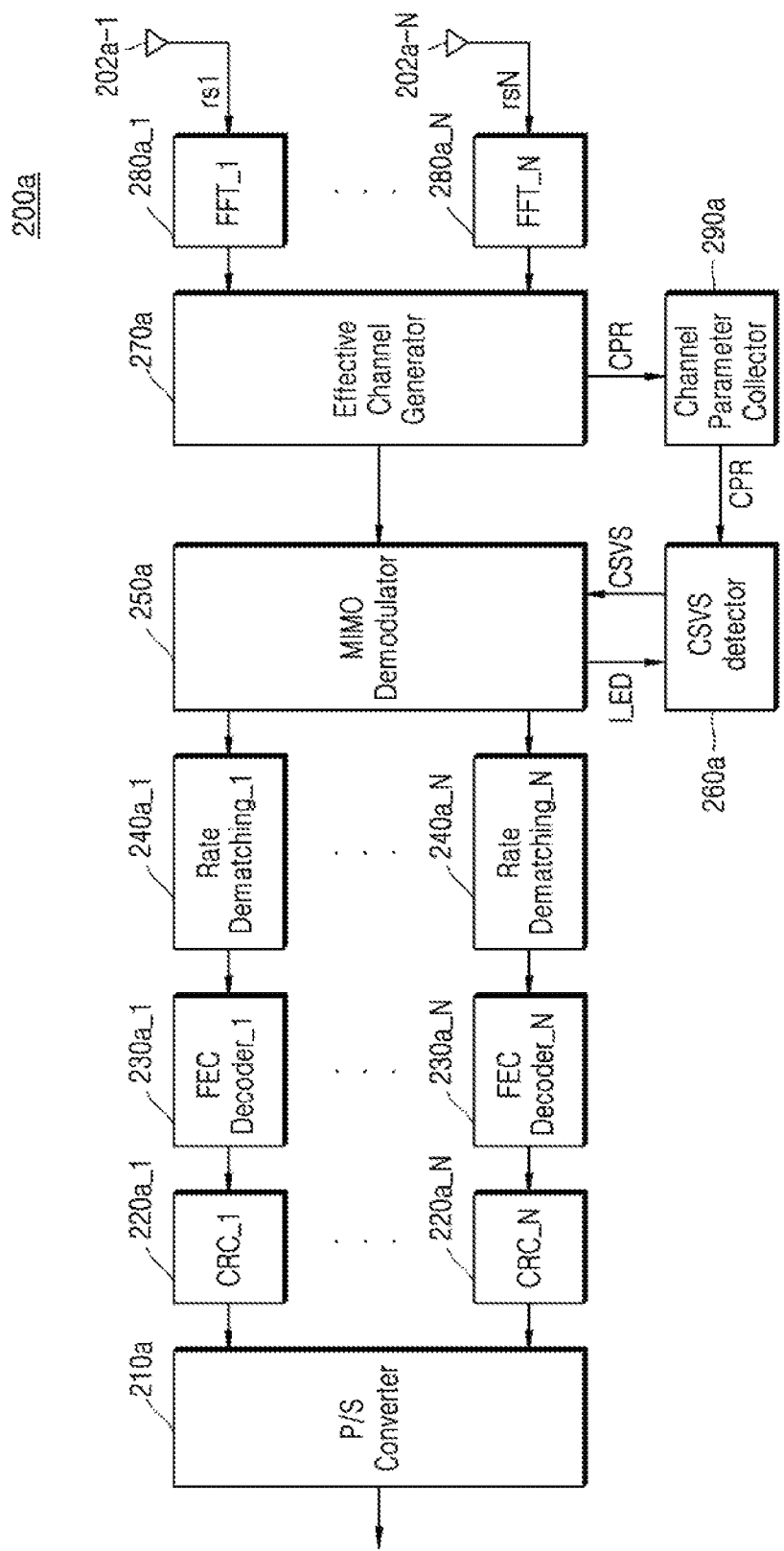
FIG. 13 is a detailed block diagram of a receiver according to another example embodiment of the inventive concept.

FIG. 13 is a detailed block diagram of a receiver 200$a$, according to another example embodiment. Description of components of FIG. 13 that are the same as those of FIG. 4 will be omitted.

Referring to FIG. 13, the receiver 200$a$ may further include a channel parameter collector 290$a$. The channel parameter collector 290$a$ may receive channel parameter information CPR from an effective channel generator 270$a$. The channel parameter information CPR may include various parameter-related information with respect to a wireless communication channel. For example, the channel parameter information CPR may include at least one of frequency/temporal/spatial correlation between the transmitter 100 and the receiver 200$a$, signal-to-noise ratio (SNR), signal-to-interference-plus-noise ratio (SINR), Doppler characteristics, such as Doppler spread or Doppler shift, delay characteristics, such as a max/min delay path, delay spread, etc., a temporal dominant path, a spatial dominant path, and angular characteristics, such as angular spread, etc.

According to an example embodiment, the channel parameter collector 290a may output the channel parameter information CPR to a vector set detector 260a. The vector set detector 260a may predetermine a critical value based on the channel parameter information CPR and select a candidate vector set CSVSa based on the predetermined critical value.

For example, the vector set detector 260a may determine whether candidate vectors having a shortest Euclidean distance at "+1" and "−1" with respect to each bit of each channel (or each layer) are included in each of the candidate vector sets and when the candidate vectors are included in each of the candidate vector sets, the vector set detector 260a may count the number of candidate vectors included in each of the candidate vector sets. The vector set detector 260a may compare the counted value with the critical value predetermined based on the channel parameter information CPR, to select the candidate vector set CSVS.

Figure 14:
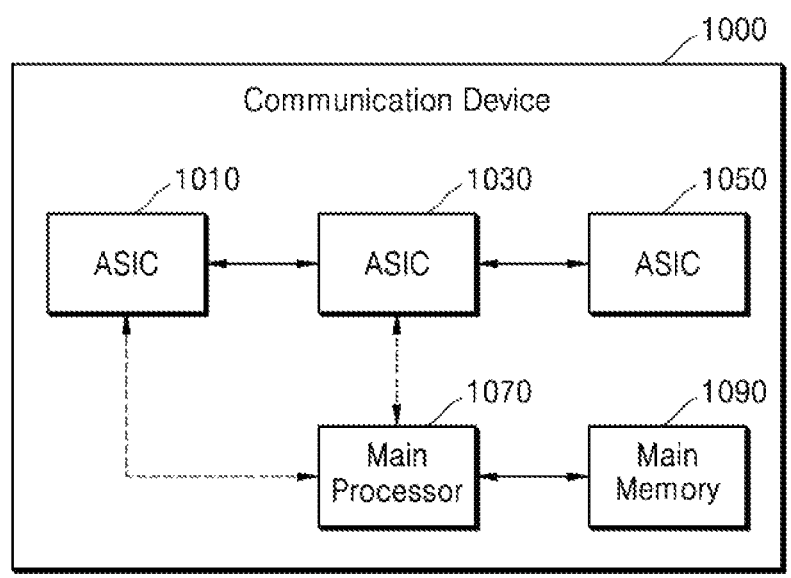
FIG. 14 is a block diagram of a wireless communication device according to an example embodiment of the inventive concept.

FIG. 14 is a block diagram of a wireless communication device 1000 according to an example embodiment. As illustrated in FIG. 14, the wireless communication device 1000 may include an application specific integrated circuit (ASIC) 1010, an application specific instruction set processor (ASIP) 1030, a memory 1050, a main processor 1070, and a main memory 1090. At least two of the ASIC 1010, the ASIP 1030, and the main processor 1070 may communicate with each other. Also, at least one of the ASIC 1010, the ASIP 1030, the memory 1050, the main processor 1070, and the main memory 1090 may be embedded in one chip.

The ASIP 1030 may be a customized integrated circuit for a specific purpose and may support an instruction set exclusive for a specific application and may execute instructions included in the instruction set. The memory 1050 may communicate with the ASIP 1030 and may store a plurality of instructions executed by the ASIP 1030 in a non-transitory storage medium. For example, the memory 1050 may include certain types of memory accessible by the ASIP 1030, such as random access memory (RAM), read only memory (ROM), tapes, magnetic discs, optical discs, volatile memory, nonvolatile memory, and a combination thereof. However, the memory 1050 is not limited thereto.

The main processor 1070 may control the wireless communication device 1000 by executing a plurality of instructions. For example, the main processor 1070 may control the ASIC 1010 and the ASIP 1030 and may process data received through an MIMO channel or a user input with respect to the wireless communication device 1000. The main memory 1090 may communicate with the main processor 1070 and as a non-transitory storage medium, may store a plurality of instructions executed by the main processor 1070.

The components of the receiver (for example, the receiver 200 of FIG. 4) or the method of selecting the candidate vector set according to the described example embodiment may be included in at least one of the components included in the wireless communication device 1000. For example, at least one of the MIMO demodulator 250 and the vector set detector 260 of FIG. 4 may be realized as a plurality of instructions stored in the memory 1050.

While the inventive concept has been particularly shown and described with reference to embodiments thereof, it will be understood that various changes in form and details may be made therein without departing from the spirit and scope of the following claims.

What is claimed is:

1. A receiver receiving a first signal comprising a plurality of symbols through a multiple input multiple output (MIMO) channel, the receiver comprising:
   a demodulator configured to calculate, for each physical channel of the MIMO channel, Euclidean distances of one or more of the plurality of received symbols with respect to all candidate vectors included in an initial candidate vector set and to output information about the Euclidean distances; and
   a vector set detector configured to select, based on the information, one of a plurality of candidate vector sets having different sizes, as a subsequent candidate vector set for calculating a log likelihood ratio (LLR) of other symbols of the plurality of received symbols or an LLR of at least one symbol of a second signal received following the first signal.

2. The receiver of claim 1, wherein the demodulator is further configured to calculate the Euclidean distances based on a candidate vector super set, which is a union of the plurality of candidate vector sets.

3. The receiver of claim 1, wherein the vector set detector is further configured to:
   determine whether candidate vectors that have "+1" and "−1" representing bits of information included in transmitted symbols corresponding to the plurality of received symbols and have a shortest Euclidean distance are included in each of the plurality of candidate vector sets;
   count the number of candidate vectors included in each of the plurality of candidate vector sets; and
   select, based on a counted value generated based on the counted number of candidate vectors, the subsequent candidate vector set.

4. The receiver of claim 3, wherein the vector set detector is further configured to compare a predetermined critical value with the counted value, and based on the comparison, to select a candidate vector set having a corresponding counted value equal to or greater than the predetermined critical value, from among the plurality of candidate vector sets, as the subsequent candidate vector set.

5. The receiver of claim 4, wherein the vector set detector is further configured to select a candidate vector set having a least size, from among the plurality of candidate vector sets each having the corresponding counted value equal to or greater than the predetermined critical value, as the subsequent candidate vector set.

6. The receiver of claim 4, further comprising
   a channel parameter collector configured to collect and output channel parameter information for each physical channel,
   wherein the vector set detector is further configured to dynamically change the predetermined critical value based on the channel parameter information.

7. The receiver of claim 1, wherein the demodulator is further configured to generate, based on the candidate vector set selected by the vector set detector, LLRs with respect to the other symbols of the plurality of received symbols.

8. The receiver of claim 7, wherein the demodulator is further configured to generate, for each physical channel, the LLRs with respect to the other symbols by calculating Euclidean distances between the other symbols of the plurality of received symbols and candidate vectors included in the subsequent candidate vector set.

9. An operation method, performed by a receiver, of receiving at least first and second transmit signals through a plurality of antennas, the operation method comprising:

calculating, with respect to the first transmit signal, Euclidean distances with respect to all of candidate vectors of an initial candidate vector set;

selecting a first candidate vector set from among a plurality of candidate vector sets, based on information about the Euclidean distances, each size of the plurality of candidate vector sets being different; and generating a log likelihood ratio (LLR) with respect to symbols of the second transmit signal based on the first candidate vector set.

10. The operation method of claim 9, wherein said generating a LLR with respect to symbols of the second transmit signal comprises calculating, with respect to the second transmit signal, Euclidean distances between received symbols thereof and all of candidate vectors included in the first candidate vector set.

11. The operation method of claim 9, wherein the calculating of the Euclidean distances comprises calculating the Euclidean distances with respect to one or more of received symbols of the first transmit signal and all of candidate vectors of a candidate vector super set, which is a union of the plurality of predetermined candidate vector sets.

12. The operation method of claim 9, wherein the selecting of the first candidate vector set comprises:

determining whether candidate vectors that have "+1" and "−1" as bits of information included in transmitted symbols corresponding to received symbols included in the received first transmit signal and have a shortest Euclidean distance are included in each of the plurality of predetermined candidate vector sets;

counting the number of candidate vectors included in each of the plurality of predetermined candidate vector sets; and selecting the first candidate vector set based on the counted number of candidate vectors.

13. The operation method of claim 12, wherein the selecting of the first candidate vector set based on the counted number of candidate vectors comprises:

comparing a counted value generated based on the counted number of candidate vectors, with a predetermined critical value;

selecting candidate vector sets from among the plurality of predetermined candidate vector sets, the candidate vector sets each having a corresponding counted value equal to or greater than the predetermined critical value; and selecting one of the selected candidate vector sets, as the first candidate vector set.

14. The operation method of claim 13, wherein the selecting one of the selected candidate vector sets, as the first candidate vector set, comprises selecting the candidate vector set from among the selected candidate vector sets, the candidate vector set having a smallest number of candidate vectors, as the first candidate vector set.

15. The operation method of claim 13, further comprising:

obtaining channel parameter information for each of the plurality of antennas, through which the signals are received; and determining whether or not to change the predetermined critical value based on the channel parameter information.

16. The operation method of claim 15, wherein the channel parameter information comprises at least one of a signal-to-noise ratio (SNR), a Doppler characteristic, and a delay characteristic.

17. A method, performed by a receiver, of detecting signals in a wireless communication system comprising a multiple input multiple output (MIMO) channel, the method comprising:

calculating, for each physical channel of the MIMO channel, information based on one or more of received transmit signals and predetermined candidate vectors, and generating, based on the information, a log likelihood ratio (LLR) with respect to the one or more of the received transmit signals;

selecting, based on the information, a first candidate vector set from among a plurality of candidate vector sets having different sizes for generating the LLR; and generating an LLR with respect to received transmit signals received subsequently to the one or more of the received transmit signals based on the first candidate vector set.

18. The method of claim 17, wherein the generating of the LLR with respect to the one or more of the received transmit signals comprises:

calculating, for each physical channel, Euclidean distances with respect to the one or more of the received transmit signals and the predetermined candidate vectors; and generating the LLR with respect to the one or more of the received transmit signals based on the Euclidean distances, wherein the information comprises information about the Euclidean distances.

19. The method of claim 17, wherein the selecting of the first candidate vector set comprises:

searching for, based on the information, candidate vectors having a shortest Euclidean distance, with respect to each of candidate vectors having "+1" and "−1" as bits of information included in transmitted symbols corresponding to one or more received symbols of the one or more received transmit signals;

counting the number of candidate vectors having the shortest Euclidean distance that are included in each of the plurality of candidate vector sets; and selecting the first candidate vector set based on a counted value generated based on the counted number of candidate vectors.

20. The method of claim 19, wherein the selecting of the first candidate vector set comprises:

comparing the counted value with a predetermined critical value; and excluding candidate vector sets of the plurality of candidate vector sets that have a corresponding counted value less than the predetermined critical value, from the selection of the first candidate vector set.

* * * * *